(12) United States Patent
Clerkx et al.

(10) Patent No.: US 8,528,722 B2
(45) Date of Patent: Sep. 10, 2013

(54) CONVEYOR ASSEMBLY AND METHOD FOR CONVEYING A SUBSTRATE CARRIER

(75) Inventors: Eduard Renier Francisca Clerkx, Eindhoven (NL); Ernst Dullemeijer, Eindhoven (NL); Franciscus Cornelius Dings, Eindhoven (NL)

(73) Assignee: OTB Solar B.V., Eindhoven (NL)

( * ) Notice: Subject to any disclaimer, the term of this patent is extended or adjusted under 35 U.S.C. 154(b) by 21 days.

(21) Appl. No.: 13/059,890

(22) PCT Filed: Aug. 21, 2009

(86) PCT No.: PCT/NL2009/050505
§ 371 (c)(1), (2), (4) Date: May 6, 2011

(87) PCT Pub. No.: WO2010/021547
PCT Pub. Date: Feb. 25, 2010

(65) Prior Publication Data
US 2011/0206485 A1    Aug. 25, 2011

(30) Foreign Application Priority Data

Aug. 22, 2008 (NL) .................................... 2001910

(51) Int. Cl.
*B65G 47/64* (2006.01)

(52) U.S. Cl.
CPC ............ *B65G 47/646* (2013.01); *B65G 47/644* (2013.01); *B65G 47/645* (2013.01); *Y10S 414/139* (2013.01)
USPC ......... 198/377.1; 414/780; 414/754; 414/939

(58) Field of Classification Search
CPC .... B65G 47/24; B65G 47/248; B65G 47/252; B65G 47/56; B65G 47/57; B65G 47/60; B65G 47/61; B65G 47/644; B65G 47/645; B65G 47/646; B65G 47/94; B61J 1/00; B61J 1/10; B61J 1/12
USPC .......... 104/48, 96, 101, 102, 130.01, 130.04; 198/377.05, 377.06, 379, 406, 407, 408, 198/409, 412, 416, 435, 463.3, 465.1, 465.2, 198/465.4, 468.5, 580, 589, 619, 680, 681, 198/717, 805, 817; 246/381, 430; 414/939, 414/940, 758, 763, 768, 769, 770, 773, 779
IPC .................. B61J 1/00, 1/10, 1/12; B65G 47/24, B65G 47/56, 47/60, 47/94, 47/248, 47/252
See application file for complete search history.

(56) References Cited

U.S. PATENT DOCUMENTS 1,841,640 A  *  1/1932  Schmidt et al. ............... 104/102
(Continued)

FOREIGN PATENT DOCUMENTS

DE          199903798 A1    8/2000
(Continued)

OTHER PUBLICATIONS

International Search Report for PCT International Patent Application No. PCT/NL2009/050505, mailed Feb. 1, 2010.

*Primary Examiner* — Saul Rodriguez
*Assistant Examiner* — Brendan Tighe
(74) *Attorney, Agent, or Firm* — Pillsbury Winthrop Shaw Pittman LLP

(57) ABSTRACT

A conveyor assembly suitable for use in a substrate processing system includes: at least one substrate carrier having a substrate-carrying surface configured to support at least one substrate; a processing track; a return track; a drive system configured to drive the substrate carrier along the processing track and the return track; and at least one swivel unit configured to pivot the substrate carrier around a substantially horizontal axis from a first orientation into a second orientation, and/or vice versa. Also provided is a method for conveying a substrate carrier including: providing a substrate carrier; positioning the substrate carrier in a first orientation; conveying the substrate carrier along a first track; and rotating the substrate carrier around a substantially horizontal axis into a second orientation.

23 Claims, 8 Drawing Sheets

(56) References Cited

U.S. PATENT DOCUMENTS

| | | | |
|---|---|---|---|
| 3,757,700 A * | 9/1973 | Nakagawa et al. | 104/165 |
| 4,492,511 A * | 1/1985 | Bilsing | 414/744.6 |
| 5,119,732 A * | 6/1992 | Lisy | 104/48 |
| 6,008,476 A | 12/1999 | Neiconi et al. | |
| 6,413,145 B1 * | 7/2002 | Pinson et al. | 451/5 |
| 7,249,670 B2 * | 7/2007 | Marian | 198/406 |
| 7,351,292 B2 * | 4/2008 | Evers et al. | 118/719 |
| 7,530,442 B2 * | 5/2009 | Gerke et al. | 198/402 |
| 2003/0010449 A1 | 1/2003 | Gramarossa et al. | |
| 2003/0188997 A1 * | 10/2003 | Tan et al. | 209/538 |
| 2004/0062633 A1 * | 4/2004 | Rice et al. | 414/935 |
| 2004/0197179 A1 * | 10/2004 | Achkire et al. | 414/618 |
| 2008/0034990 A1 | 2/2008 | Hilpert et al. | |

FOREIGN PATENT DOCUMENTS

| | | |
|---|---|---|
| EP | 1365040 A1 | 11/2003 |
| RU | 2038993 C1 | 7/1995 |
| WO | WO 2010021547 A1 * | 2/2010 |

* cited by examiner

CONVEYOR ASSEMBLY AND METHOD FOR CONVEYING A SUBSTRATE CARRIER

CROSS REFERENCE TO RELATED APPLICATIONS

This is the U.S. National Phase of PCT/NL2009/050505, filed Aug. 21, 2009, which in turn claims priority to Netherlands Patent Application No. 2001910, filed Aug. 22, 2008, the entire contents of each of which are incorporated herein by reference in their entirety.

The invention relates to a conveyor assembly that is suitable for use with a substrate processing system, comprising at least one substrate carrier having a substrate-carrying surface for supporting at least one substrate; a processing track; a return track; and a drive system for driving the at least one substrate carrier along the processing track and the return track.

Such a conveyor assembly is known from, for example, European patent EP 1,365,040 in the name of applicant.

During the processing of substrates, in particular fragile substrates such as thin (e.g. 250 µm or less) glass plates or semiconductor wafers, there is a significant danger of substrate fracture. Fracture of a substrate may for example be caused by processing conditions, such as extreme temperatures, or by mechanical contact with the substrate either during the actual treatment or during substrate handling in loading and unloading stations. Conveyor systems of the above-described type are employed to convey substrates along one or more processing stations using a substrate carrier that provides a surface for the substrates to rest on. When a substrate fractures during processing, its pieces are left on the substrate-carrying surface of the carrier. Before the carrier can be reloaded with a new substrate, the remnants of the broken substrate will need to be removed. As common substrate handlers rely on the integrity of the substrate, this is a task they may not be able to perform. The substrate treatment assembly disclosed in EP 1,365,040 is therefore fitted with special stations for hoovering up substrate remnants from the carrier's surface.

However, a hoovering station is a relatively complicated, expensive en sizable device that takes a relatively long time to clean up a carrier surface. The present invention aims to provide an improved conveyor assembly, particularly an assembly that is relatively compact, and capable of efficiently disposing of the remnants of a fractured substrate and/or other contaminants.

To this end, the invention provides a conveyor assembly of the above-referenced type, that is characterized in that it comprises a swivel unit configured to pivot the substrate carrier around a substantially horizontal axis from a first orientation into a second orientation, and/or vice versa.

Such a conveyor assembly allows a substrate carrier, and with it its substrate carrying surface, to be tilted or even turned so that any loose contaminations, for example remnants of a fractured substrate or deposition waste due to parasitic deposition, fall off the carrier. The material coming off from the carrier may be collected in a container disposed below the swivel unit. As will be elucidated below, a swivel unit can be constructed from relatively few mechanical components, making it a simple, reliable and economically manufacturable device. As the swivel unit can operate quickly, it is also suitable for use with a high-throughput substrate processing system having a production capacity above 1000 wafers per hour, or more.

In a further embodiment, the conveyor assembly, for example the swivel unit, can also be configured to subject the substrate carrier to a supplementary translational motion to transfer the substrate carrier from the first to the second orientation.

If so desired, the swivel unit—or a different part of the assembly—may impose a rocking motion on the substrate carrier, so as to shake off any debris of the carrier's surface. It may also comprise a stop against which the carrier may be gently beaten to dislodge remnants that are somewhat sticky, for example due to a preceding processing treatment. Alternatively, the swivel unit may be exposed to a gas/air flow or vibrations to break sticky pieces free of the carrier. The swivel unit may be disposed in the processing track, in the return track, or in between the processing track and the return track, for example depending on the likelihood of a substrate fracture occurring at a certain location along the tracks. Further, the swivel unit may be operated automatically or manually. An automatically operated swivel unit may be activated either incidentally, depending on the output of a substrate fracture sensor such as a camera that inspects the carrier surface of every passing substrate carrier, or continually for every passing carrier, independent of any indication of the condition of the carrier's surface.

With regard to the terminology used in this text, it is noted that the phrase 'substantially horizontal' is intended to comprise any direction that includes an acute angle of less than 45 degrees, particularly 20 degrees, with a plane normal to the direction of gravity. Likewise, the phrase 'substantially vertical' is intended to comprise any direction that includes an acute angle between 45 and 90 degrees, particularly between 70 and 90 degrees, with a plane normal to the direction of gravity. It is also contemplated that the processing track and the return track may not constitute wholly separate tracks, but for example one and the same track instead, or tracks that partially coincide.

According to a further elaboration of the invention, the first orientation corresponds to a substantially horizontally oriented substrate-carrying surface of the substrate carrier. The second orientation—departing from the first orientation—can, for example, obtained by a pivoting motion through an angle between 70 and 270 degrees, for example through an angle of 90 and 270 degrees.

The first orientation is preferably horizontal, corresponding to a substrate carrier that supports one or more substrates from below. The second orientation, on the other hand, is best chosen such that the carrying surface does not support the debris to be disposed of, allowing gravity to use the full weight of the debris to remove it. Departing from the first, horizontal orientation, this is achieved by pivoting the carrier through an angle between 70 and 270 degrees. In case the substrate carrier is rotated around an axis that is located much to the side of the carrying surface, rotation through angles of around 180 degrees may require a significant amount of space. For example, rotation of a rectangularly shaped carrier around an axis coinciding with one of its rectangular sides through an angle of 180 degrees, whereby the axis extends in a transport direction of the carrier, would double the width of the transport track in terms of its effective footprint. Apparatus for use in commercial production lines are preferably kept compact, with special attention for footprint minimization. Consequently, the second orientation is preferably obtained by pivoting the carrier through an angle between 70 and 120 degrees departing from the first orientation, for example an angle in the range of 90-120 degrees, more particularly an angle of 110 degrees.

According to a further elaboration of the invention, the conveyor assembly may comprise two swivel units, a first swivel unit for example being disposed between an end point of the processing track and a starting point of the return track, and a second swivel unit for example being disposed between an end point of the return track and a starting point of the processing track.

The two swivel units may be used to perform opposite actions. The first swivel unit, for example disposed downstream of a discharge station that unloads substrates from the carrier's surface, may pivot the carrier from its first, horizontal position into its second, tilted position to remove any contaminants. The substrate carrier, still in its second position, may then be transported along the return track, back to the starting point of the processing track, where it is pivoted back into its first horizontal position to be loaded with new substrates. An advantage of this setup is that the footprint of the return track may be relatively small as the substrate carriers may be transported in a tilted, possibly (near) vertical position. To implement the transportation of a substrate carrier in its first and second positions, the processing track and the return track may be provided with guide means, for example guide rails, that help ensure that the substrate carrier maintains its given orientation during transport.

According to a further elaboration of the invention, the processing track is disposed substantially above or below the return track. This not only minimizes the footprint of the conveyor assembly, it may also enable improved compactness of a respective system in which it is implemented, as a whole. For example, in case the processing track is disposed above or below the return track, and substrate carriers are transported along the processing track in a first, substantially horizontal orientation and along the return track in a second, more or less upright orientation, an elongate space below respectively above the processing track (and next to the return track) is rendered available, which space may be exploited to accommodate one or more other parts of the system, e.g. vacuum pumps, power supplies, control units etc. Compared to a system wherein the tracks and the parts are either all stacked or juxtaposed, this configuration allows for a significantly smaller footprint and improved compactness. Such a system may for example be a substrate processing system according to the features of claim 18.

According to an further elaboration of the invention, the conveyor assembly comprises a number of rollers, for example wheels, mounted on the substrate carrier, and at least one rail extending along at least a part of the processing track and/or the return track, said rail being configured for cooperation with the roller(s) on the substrate carrier, such that the substrate carrier is rollably moveable over the rail along said part of said track.

In one embodiment, for example, at least a portion of the processing track is defined by a first guide rail, and the substrate carrier comprises a first set of rollers that are configured for cooperation with the first guide rail, such that the substrate carrier is rollably moveable over the first guide rail along said portion of the processing track.

In another embodiment, for example, at least a portion of the return track is defined by a second guide rail, and the substrate carrier comprises a second set of rollers that are configured for cooperation with the second guide rail, such that the substrate carrier is rollably moveable over the second guide rail along said portion of the return track.

In a combination of these embodiments, at least one swivel unit may be configured for transferring a substrate carrier from the first guide rail of the processing track onto the second guide rail of the return track, and/or vice versa, by pivoting the substrate carrier around a substantially horizontal axis between its first orientation and its second orientation. To this end, the at least one swivel unit may comprise a first and a second guide rail extension, arranged such that the first guide rail extension is in alignment with the first guide rail when the swivel unit holds the substrate carrier in its first orientation, and wherein the second guide rail extension is in alignment with the second guide rail when the swivel unit holds the substrate carrier in its second orientation. The at least one swivel unit may thus serve as a switch between the processing track and the return track, allowing substrate carriers to be easily moved onto and off the swivel unit when it is in alignment with either the processing or the return track.

According to an aspect of the invention, the return track extends at least partly through a conditioned environment, e.g. an environment wherein an inert gas is present and/or certain temperature conditions are enforced, and/or e.g. an interior environment that is sealed from an exterior environment, for example a vacuum environment.

The invention also provides for a method for conveying a substrate carrier, comprising: providing a substrate carrier; positioning the substrate carrier in a first orientation, conveying the substrate carrier along a first track, and rotating the substrate carrier around a substantially horizontal axis into a second orientation.

By rotating the substrate carrier, and in particular a substrate-carrying surface thereof, contaminants present on the substrate-carrying surface of the substrate carrier are efficiently disposed of. The method may, inter alia, be used advantageously in substrate processing systems, for example semiconductor wafer processing systems, wherein more sizeable and costly equipment, such as hoovering stations, tend to be used.

The method may further comprise conveying the substrate carrier in the second orientation along a second track, and rotating the substrate carrier around a substantially horizontal axis, back into its first orientation; and/or collecting any material falling off the substrate carrier due to a change in its orientation or any other specific action taken to dislodge contaminants from the carrier, for example subjecting it to a gas flow or vibrations.

It is noted that the first track and the second track may not constitute wholly separate tracks, but for example one and the same track instead, or tracks that partially coincide. In an advantageous embodiment, the first and the second track are connected, for example by means of an aforementioned swivel unit, to form an endless path along which substrate carriers may be driven continuously. The first and second tracks may be disposed one above the other, so as to minimize the footprint and space occupation of a device that executes the method.

The above-discussed and other features and advantages of the invention will be more fully understood from the following detailed description of certain embodiments of the invention, taken together with the accompanying drawings, which are meant to illustrate and not to limit the invention.

DETAILED DESCRIPTION OF THE DRAWINGS

Figure 1:
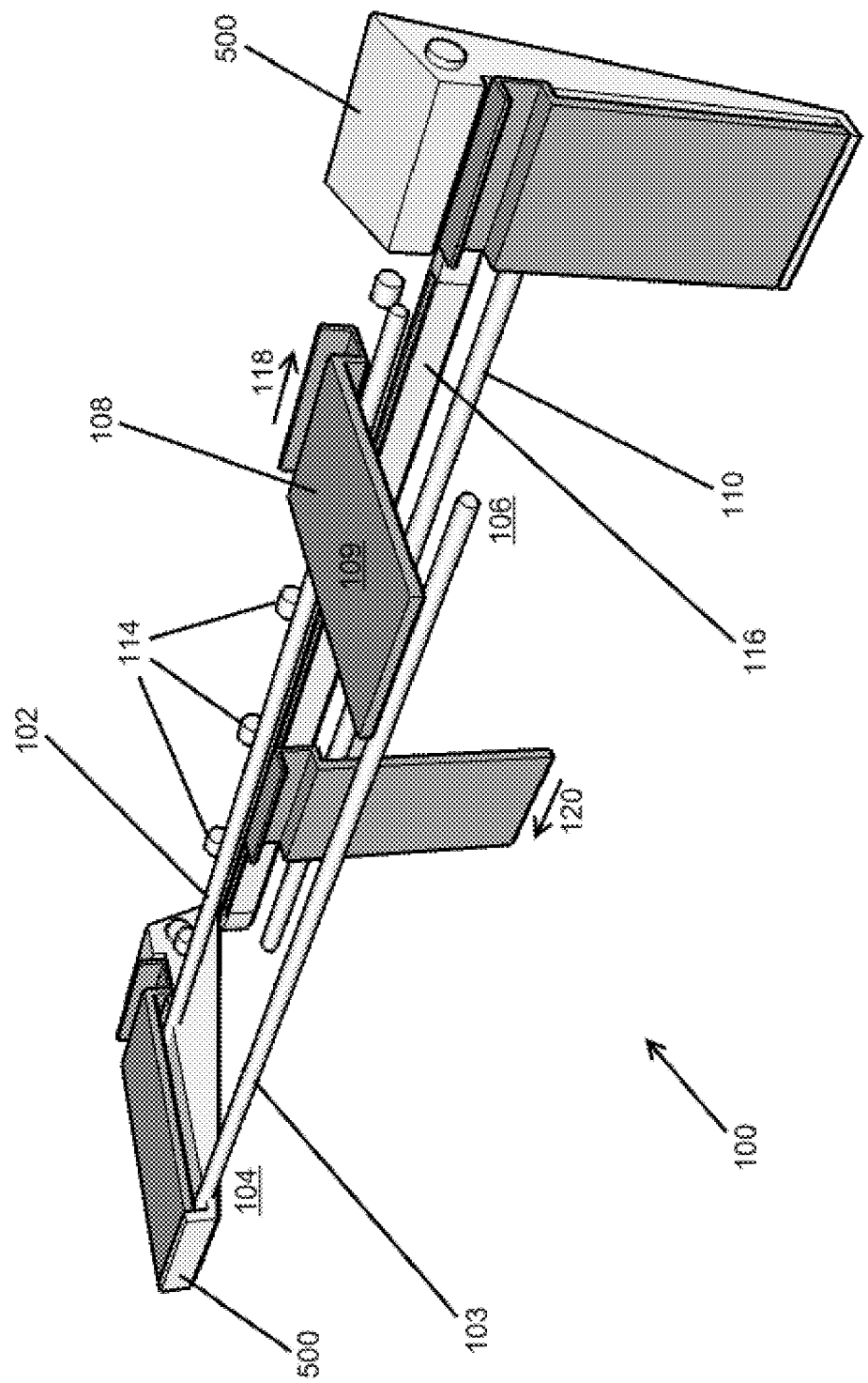
FIG. 1 is a schematic perspective view of an exemplary disclosed conveyor assembly.

FIG. 1 schematically shows an exemplary conveyor assembly 100 according to the present invention. Conveyor assembly 100 comprises an upper processing track, which is embodied by two guide rails 102, 103. It is contemplated that in other embodiments of the conveyor assembly 100 the processing track may be embodied by a different number of guide rails. A further guide rail may for example be used to offer extra support to relatively heavy parts of the substrate carrier 108, such as the area's onto which magnets 112—to be discussed hereafter—are mounted. The processing track leads from a starting point 104 to an end point 106 thereof. Typically, the starting point 104 may be associated with a loading position for placing substrates onto a substrate carrier 108 having a substrate-carrying surface 109 that is subsequently sent off along guide rails 102, 103 of the processing track. Likewise, end point 106 of the processing track may be associated with a discharge or unloading position for removing properly processed substrates from the substrate carrier 108. One or more processing stations for performing substrate treatments may be disposed along the processing track, in between starting point 104 and end point 106 (see also FIG. 8).

To allow substrate carriers 108 that have been conveyed along the one way processing track to be transported back to the starting point 104 thereof, a return track is provided. The return track is embodied by a guiderail 110. The connections between the processing track and the return track are provided for by swivel units 500, which operate much like switches that allow a substrate carrier 108 to be transferred rotationally from the processing track to the return track, or vice versa. Swivel unit 500 and its operation will be discussed in more detail later on. Together with swivel units 500, the processing track and the return track form an endless path along which substrate carriers 108 can be conveyed. In FIG. 1 the return track is arranged substantially below the processing track to minimize the footprint of the return track, and that of the conveyor assembly 100 as a whole. It is noted however, that the position of the processing track relative to the return track may, in principle, be chosen arbitrarily. In some cases, it may be desirable to position the processing track relative to the return track in such a way that a substrate carrier 108 cannot be switched between them by a (single) rotational motion alone. In these cases, the substrate carrier 108 may be subjected to a supplementary translational motion, executed either by the swivel unit 500 or another translating device.

A drive system is provided to drive a substrate carrier 108 along the endless path made up of the processing track and the return track. The exemplary drive system depicted in FIG. 1 is twofold. That is, the drive mechanism used for transporting substrate carriers along the processing track differs from the mechanism used for transporting substrate carriers 108 along the return track. In both cases though, use is made of a series of permanent magnets 112 (not visible in FIG. 1; see FIG. 3) that are mounted on a bottom side the substrate carrier 108.

To drive a substrate carrier 108 along the processing track, electric coils 114 are provided alongside of guide rail 102. The electric coils may be powered to generate a magnetic field that interacts with the magnetic field of the magnets 112 mounted on the substrate carrier, thereby transferring energy to the carrier 108 so as to move it in transport direction 118. Such an electromagnetic drive system offers the advantage of independent control over the motion of individual carriers 108, while maintenance requirements are kept to a minimum as the parts of the drive system hardly demonstrate any wear. In addition, the electric coils 114 may be disposed outside of a conditioned processing environment—particularly a vacuum environment—, which is especially advantageous in case substrate treatments are performed that might soil or harm the coils.—The drive system to drive the carriers 108 along the processing track can be the same as, or correspond to, the conveyor system described by EP 1,365,040, incorporated to that aim in this text by reference.

A belt 116, extending in a direction parallel to guide rail 110, is provided to drive substrate carriers 108 in a direction 120 along the return track. Belt 116 is provided with or made of a magnetizable material such as iron, which is magnetized in the presence of the magnets 112 mounted on a substrate carrier 108. Once magnetized, belt 116 and a carrier 108 are magnetically linked, and movement of the belt will drive the carrier along guide rail 110. Alternatively, belt 116 can include permanently magnetic material that interacts with magnets 112.

It is clear from FIG. 1 that substrate carriers 108 on the processing track are oriented differently from substrate carriers 108 on the return track. Carriers 108 on the processing track are oriented substantially horizontally, while carriers 108 on the return track are oriented substantially vertically. Both at the starting point 104 and the end point 106 of the processing track, substrate carriers 108 are re-oriented by pivoting them around a substantially horizontal axis that extends in a direction parallel to guide rails 102, 110. The re-orientation is performed by the swivel units 500. Pivoting a substrate carrier 108 from its substantially horizontal position into its substantially vertical position may particularly serve to throw off remnants of fractured substrates or other loose contaminations from the substrate-carrying surface 109 of the substrate carrier.

It is understood that the drive system shown in FIG. 1 is exemplary. A multitude of alternative drive systems for driving a substrate carrier along a track are known in the art, and the topic need not be elaborated on here. For example, the drive system—though advantageous—need not be magnetic in nature: for example, a conventional chain conveyor may be used to transport a substrate carrier 108 along the processing track. Also, for example, driven belt 116 or another type of drive means may couple with the substrate carrier 108 through mechanical friction, clamping, gripping, or otherwise, to drive it along the return track.

FIG. 1 provides a relatively high level overview of an exemplary embodiment of a conveyor assembly 100 according to the present invention. Hereafter, more detailed exemplary embodiments of a substrate carrier 108 and a swivel unit 500 will be disclosed.

Figure 2:
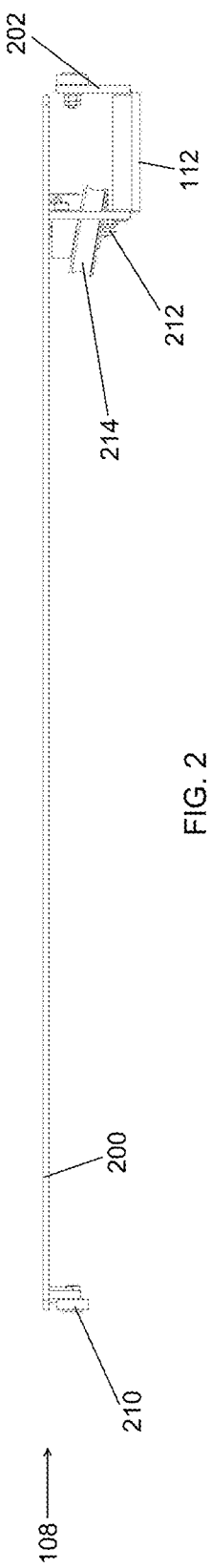
FIG. 2 is a side view of an exemplary substrate carrier that may be used in the conveyor assembly according to the present invention.
Figure 3:
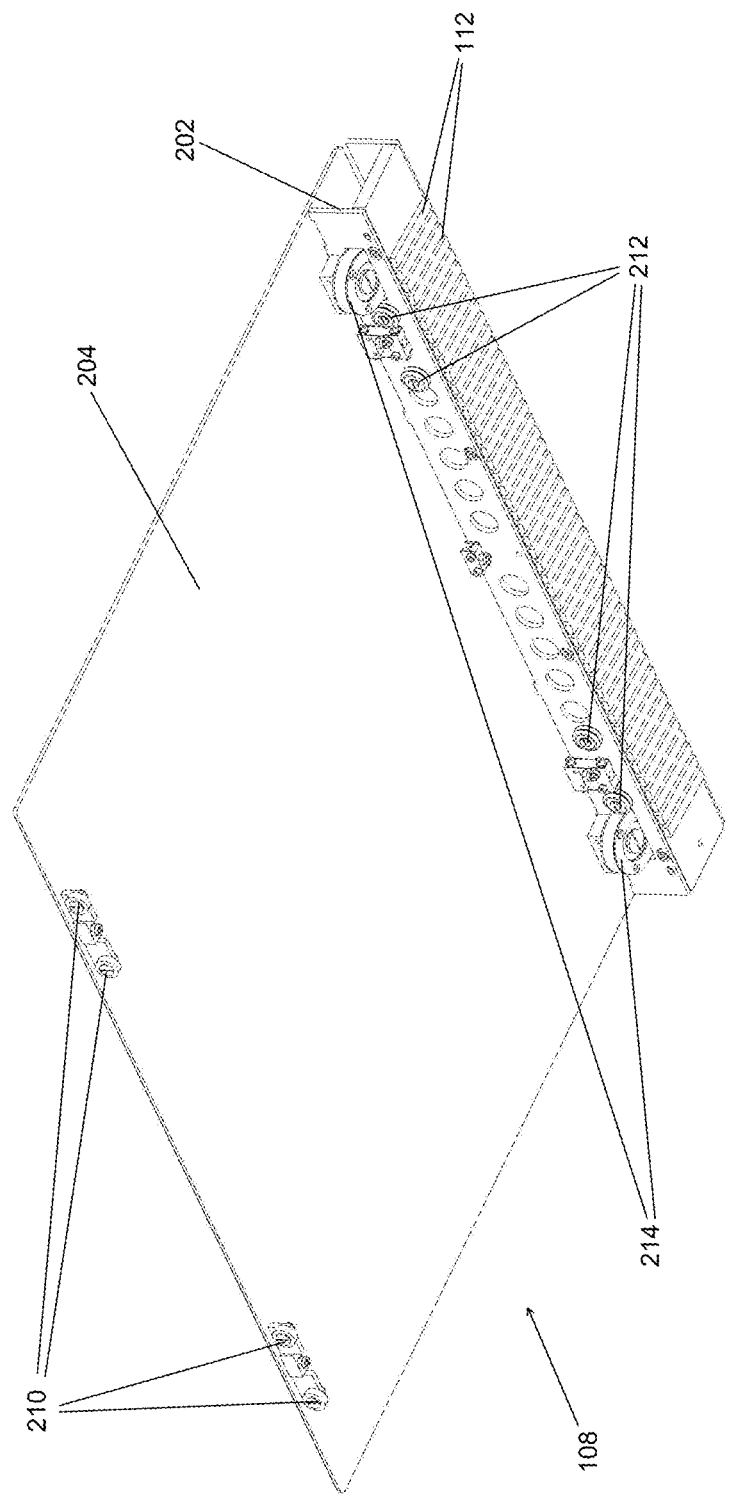
FIG. 3 is a perspective view of a bottom side of the substrate carrier shown in FIG. 2.
Figure 4:
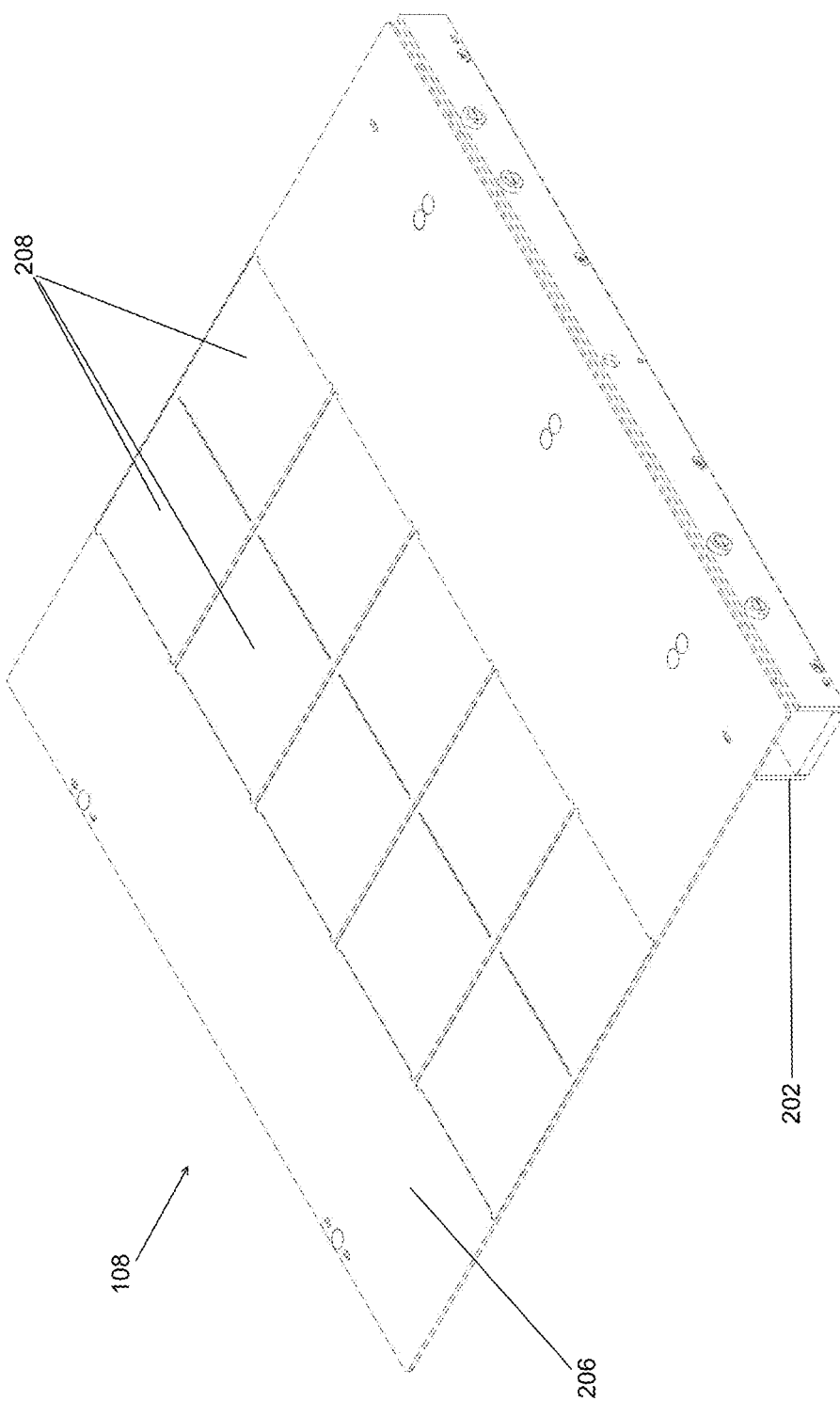
FIG. 4 is a perspective view of a top side of the substrate carrier shown in FIG. 2.

Referring now to FIG. 2-4, which show a substrate carrier 108 in considerable detail. Substrate carrier 108 plays an important role in achieving a substrate processing system having a high throughput capacity. Its dimensions are preferably chosen such that it can support a significant amount of wafers, e.g. 10 or more, for simultaneous processing. The depicted substrate carrier 108 comprises a rectangular carrier plate 200, and a U-shaped profile 202 that is connected to a bottom side 204 of the carrier plate 200, nearby and parallel to a rectangular side thereof. A top side 206 of carrier plate 200 is provided with a number of substantially square recesses 208 configured for receiving a same number of substrates. A bottom side of the U-profile is provided with the series of permanent magnets 112, whose function as part of the drive system has already been discussed above.

Bottom side 204 of carrier plate 200 is provided with two pairs of mutually aligned rollers 210, disposed close to a rectangular side of carrier plate 200 opposite to the U-profile 202. The U-profile 202 itself is also provided with four correspondingly aligned rollers 212. The rollers 210, 212 are configured for cooperation with guide rails 102, 103 of the processing track, and have an axis of rotation that extends substantially parallel to the carrier plate 200. The rollers 210, 212 support substrate carrier 108 as it moves along the processing track, and allow it to be conveyed smoothly.

Besides the rollers 212, the U-profile is provided with another pair of rollers 214. These rollers 214, having a somewhat larger diameter than rollers 210, 212 and an axis of rotation that extends almost perpendicularly to the carrier plate 200, are configured for cooperation with guide rail 110 of the return track. The angle included by the axes of rotation of rollers 214 and the carrier plate 200 is related to the angle through which the substrate carrier 108 is pivoted by swivel unit 500 to be discussed hereafter.

Figure 5:
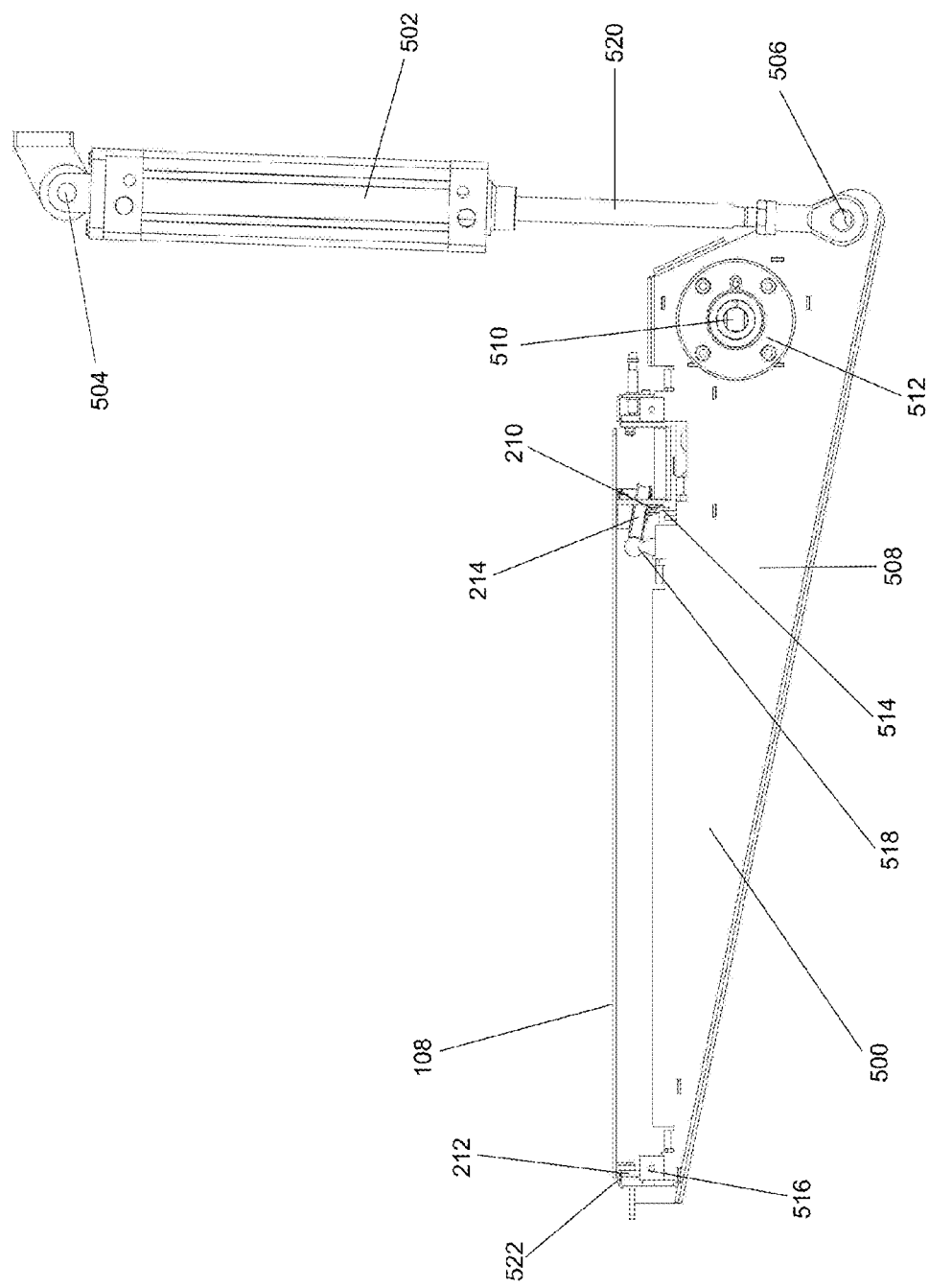
FIG. 5 is a side view of an exemplary disclosed swivel unit with the substrate carrier of FIG. 2 inserted therein.
Figure 6:
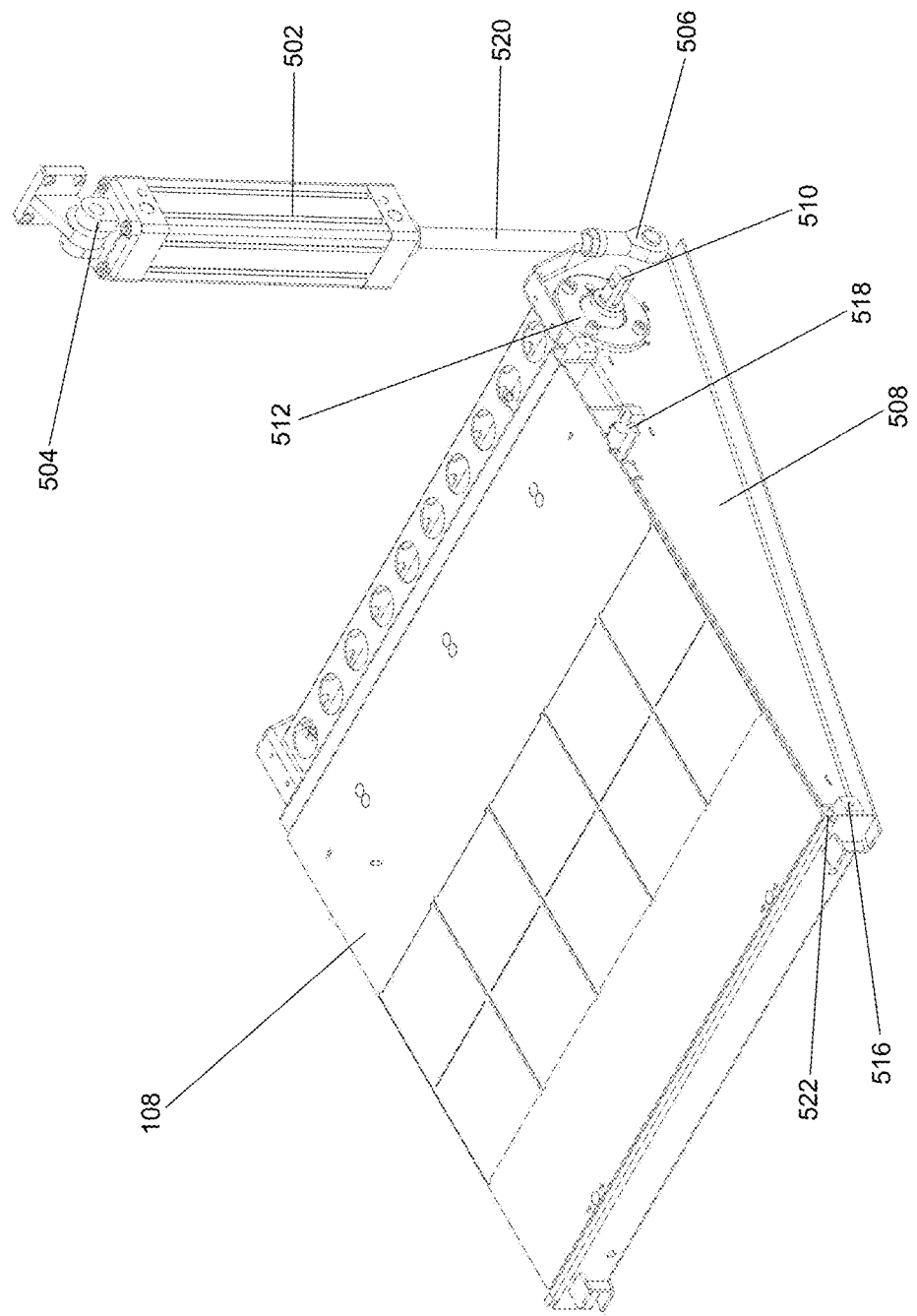
FIG. 6 is a perspective view of an exemplary disclosed swivel unit with the substrate carrier of FIG. 2 inserted therein, and illustrates the situation shown in FIG. 5 from a different angle.

Referring now to FIGS. 5 and 6, which illustrate an exemplary swivel unit 500 in which the exemplary substrate carrier 108 of FIG. 2-4 is inserted.

Swivel unit 500 comprises a cylinder-piston assembly 502, 520, a cylinder end 504 thereof being pivotably connectable to the fixed world, and a piston rod end 506 thereof being pivotably connected to a casing 508 of the swivel unit. The casing 508 can be pivotably suspended by means of two bearing mounts 512 having a pre-assembled shaft portion 510. The two bearing mounts 512 are provided on opposite sides of the casing 508 of the swivel unit 500, such that only one is visible in FIG. 5. The swivel unit 500 further comprises two rail extensions 514, 516 configured for cooperation with rollers 210 and 212 respectively, and one rail extension 518 configured for cooperation with rollers 214. The rail extensions 514, 516 may be thought of as elongations of processing track guide rails 102 and 103 respectively, while rail extension 518 can be said to be an elongation of guide rail 110 of the return track. Swivel unit 500 also comprises a flange 522 which engages rollers 212.

The operation of a swivel unit 500 disposed at end point 106 of the processing track may be as follows. In a first orientation of swivel unit 500, the rail extensions 514, 516 are aligned with guide rails 102 and 103 of the processing track. A substrate carrier 108 being driven along guide rails 102 and 103, and reaching end point 106 of the processing track, is thus automatically driven into swivel unit 500. As a substrate carrier 108 is inserted, rollers 212, 210 will engage the rail extensions 514, 516. Likewise, roller 214 will engage rail extension 518. At this point substrate carrier 108 is still supported by rollers 212, 210. When a substrate carrier 108 is fully inserted, cylinder-piston assembly 502, 520 may be activated to retract piston rod 520 into the cylinder 502, thereby causing casing 508, and thus substrate carrier 108 inserted therein, to rotate downward around shaft 510. The precise, final angle through which casing 508 and carrier 108 are rotated depends on the distance over which piston rod 520 is retracted, and is for the shown embodiment set to approximately 110 degrees. It is noted that piston rod 520 need not necessarily be retracted in a single, fluent motion. It may, for example, be made to intermittently slide in and out of cylinder 502 to impose a shaking motion on substrate carrier 108. In that case, flange 522 may serve to maintain proper contact between swivel unit 500 and substrate carrier 108. When swivel unit 500 ends its swiveling action, casing 508 and carrier 108 have reached their second orientation. Substrate carrier 108 is now supported by rollers 214 that rest on rail extension 518, which—due to the rotation—has come into alignment with guide rail 110 of the return track. The re-orientation has also brought magnets 112, provided on a bottom side of U-profile 202, into the reach of belt 116. The movement of belt 116 will draw substrate carrier 108 from swivel unit 500, onto guide rail 110 of the return track, and convey it towards the starting point of the processing track. During transport along the return track, a substrate carrier is preferably made to maintain its orientation. If this orientation tends to be negated by for example gravity, an extra guide rail may be provided, e.g. a guide rail in alignment with flange 522.

Figure 7:
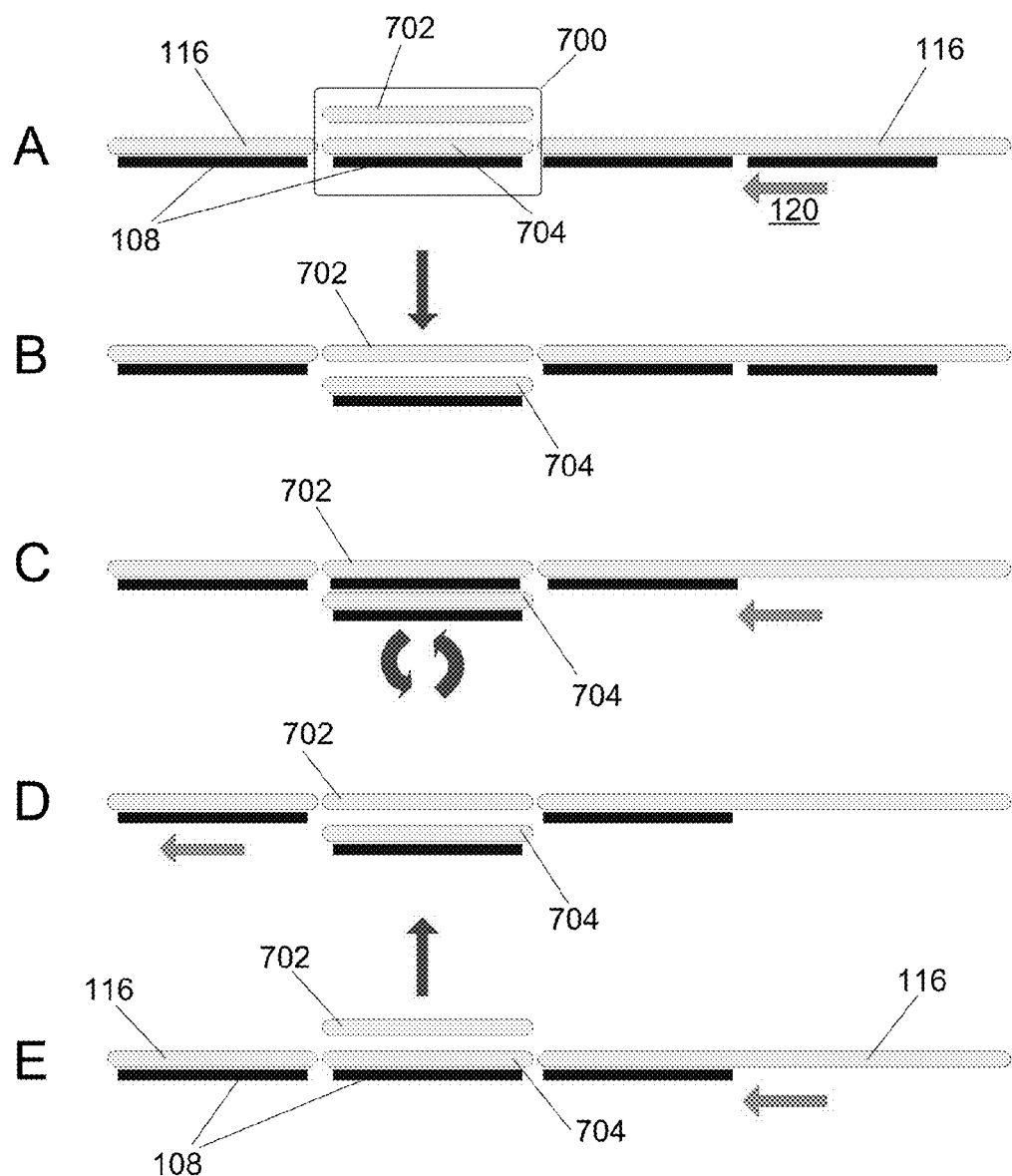
FIG. 7 schematically illustrates the operation of an optional carrier exchange unit.

FIG. 7 schematically illustrates the operation of an optional carrier exchange unit 700 (see FIG. 8) that may be included in a conveyor assembly 100 according to the present invention. A carrier exchange 700 unit allows a substrate carrier 108 already on the processing or return track to be side-tracked, or a new substrate carrier 108 to be inserted into a stream of carriers present on either one of the tracks, without halting the assembly 100 as a whole. Side-tracking of a substrate carrier may for example be desired in case one or more substrate carriers 108 need thorough inspection or maintenance, while insertion of a carrier 108 may allow a so called 'dummy carrier' to be slipped into a substrate carrier stream. The dummy carrier can be fitted with measurement equipment, such as a thermocouple and temperature data recorder, to assess the precise conditions substrates are subjected to during processing.

A carrier exchange unit 700 incorporated in the return track of conveyor assembly 100 shown in FIG. 1 may operate as follows. Situation A, depicting a schematic top view of the return track, illustrates normal operating conditions. Belt 116, which is now divided into two sections, conveys substantially vertically oriented substrate carriers 108 along the return track in direction 120. The exchange unit 700 is disposed between the two sections of belt 116, and comprises two belts 702, 704. In a production state of the exchange unit 700, belt 704 is aligned with both sections of belt 116 such that a substrate carrier 108 being transported along the return track is automatically handed over from a first section of belt 116, to belt 704, and on to a second section of belt 116. Belts 116 and 704, in other words, operate as a single continuous belt. When a substrate carrier 108 whose exchange is desired enters the exchange unit 700, belts 702 and 704, which may be mounted in a slideable frame, can be brought forward swiftly by an actuator, such as a hydraulic cylinder. This is shown in situation B. Belt 702 thereby takes the place of belt 704, while belt 704—together with substrate carrier 108 to be exchanged—is brought outside of the stream of substrate carriers moving along the return track. The respective substrate carrier can now be inspected, serviced, replaced etc., as shown in situation C. Obviously, when the carrier exchange unit 700 is placed inside a vacuum environment, the vacuum may need to be cancelled first, possibly leading to downtime of the production line. This is why the carrier exchange unit 700 is preferably disposed in an atmospheric part of the return track.—To insert a substrate carrier into the stream of substrates, the described steps may be executed in reverse. Once belt 702 is temporarily not conveying a substrate carrier 108, as shown in situation D, the two belts 702, 704 may be moved backwards, so as to line up belt 704 with both sections of belt 116, thus inserting the substrate carrier held by belt 704 into the stream, as shown in situation E.—It is noted that no guide rails, in particular no guide rail 110, are shown in FIG. 7 for reasons of clarity. In reality however, they may be present, in which case they are sectioned in the same way that belt 116 is. The substrate carrier exchange unit 700 may, of course, by analogy with the belts 702, 704, also provide for exchanger guide rail sections mounted on the frame of the unit. Each of these exchanger guide rail sections is then brought into alignment with the primary sections of guide rail 110 of the return track when their respective associated exchanger belt 702, 704 is aligned with the sections of belt 116.

Figure 8:
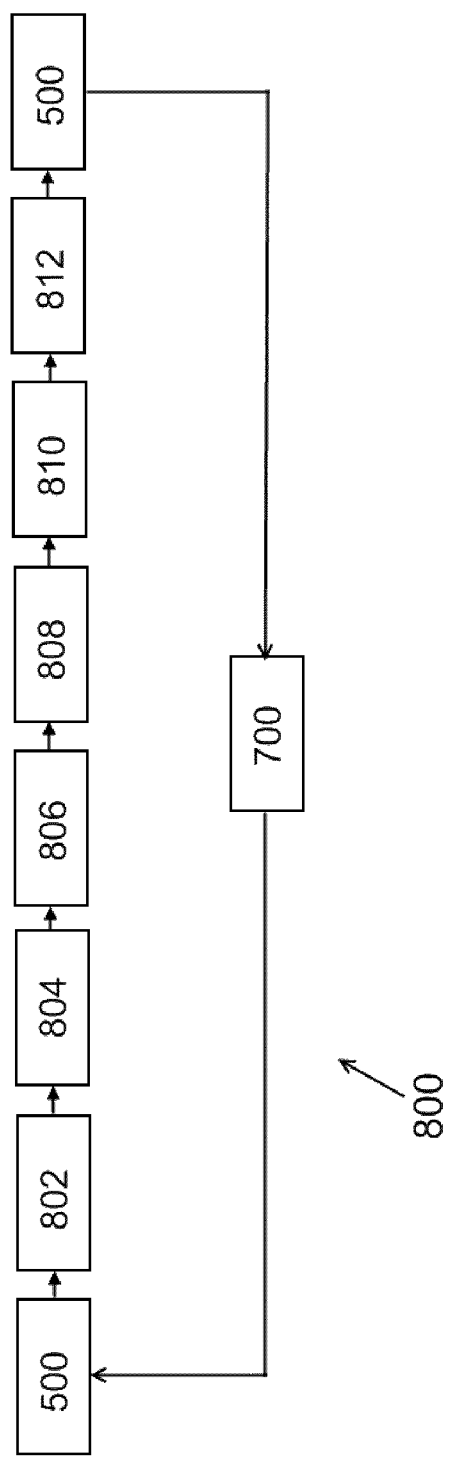
FIG. 8 diagrammatically illustrates a substrate processing system in which a conveyor assembly according to the invention may be incorporated.

FIG. 8 diagrammatically illustrates an exemplary substrate processing system 800 in which a conveyor assembly 100 according to the present invention may be used advantageously. For example, the system can comprise a first load lock 804 and a second load lock 810, being configured to seal a conditioned (interior) environment of one or more processing stations, for example a vacuum environment, from an exterior environment. Substrate processing system 800 comprises a loading station 802 where substrate carriers 108 may be loaded with one or more substrates that require processing. The substrates may be taken from supplied cassettes by a substrate handler such as a Bernoulli gripper, and be placed on a substantially horizontally oriented substrate carrying surface 109 of the substrate carriers 108. The substrate carriers 108 may then be moved through the first load lock 804, into the conditioned (for example vacuum) environment. The conditioned environment may accommodate a number of processing stations, such as a heating station 806, and/or one or more deposition stations 808 for subjecting substrates to for example a sputtering, CVD, PECVD or lithography treatment. The substrates may then be conveyed through the second load lock 810, into an atmospheric exterior environment, and on to a discharge location 812 where the processed substrates may be inspected. Properly processed and unfractured substrates may be unloaded from the substrate carriers 108 and be placed into transport cassettes. The discharged substrate carriers 108 may then be conveyed further to a swivel unit 500, which pivots the substrate carriers 108 around a substantially horizontal axis to dispose of any material purposefully left on the carriers 108 at the unloading location 812. Next, the substrate carriers may be transported back to their point of departure via a return track that includes a substrate carrier exchange unit 700. In case the substrate carriers 108 are transported along the return track in an orientation that differs from the one they have along the processing track, a second swivel unit 500 may be provided ahead of loading station 802 to pivot the carriers 108 back into their desired orientation.

While the invention has been described with reference to certain embodiments, it will be understood by those skilled in the art that various changes may be made and equivalents may be substituted for elements thereof without departing from the scope of the invention. In particular, elements shown in one or more embodiments may be combined with other shown embodiments or elements thereof to obtain new embodiments that fall within the scope of the claims. It is thereby understood that phrases like "one embodiment", "an embodiment" and "another embodiment" do not necessarily refer to different embodiments. In general, embodiments introduced with phrases like these may be combined with each other to form further embodiments. Therefore, it is intended that the invention not be limited to any particular embodiment disclosed for carrying out this invention, but that the invention includes all embodiments falling within the scope of the appended claims.

LIST OF ELEMENTS

100 Conveyor assembly
102, 103 Guide rail of processing track
104 Starting point of processing track
106 End point of processing track
108 Substrate carrier
109 Substrate-carrying surface
110 Guide rail of return track
112 Permanent magnets
114 Electric coils
116 Belt
118 Transport direction along processing track
120 Transport direction along return track
200 Carrier plate
202 U-profile
204 Bottom surface of carrier plate
206 Top surface of carrier plate
208 Recess for receiving a substrate
210 Roller for cooperation with processing track guide rail 102
212 Roller for cooperation with processing track guide rail 103
214 Roller for cooperation with return track guide rail 110
500 Swivel unit
502 Cylinder
504 Cylinder end
506 End of piston rod
508 Casing
510 Shaft portion
512 Bearing mount
514 Rail extension for guide rail 102
516 Rail extension for guide rail 103
518 Rail extension for guide rail 110
520 Piston rod
522 Flange
700 Substrate carrier exchange unit
702, 704 Belt of the substrate carrier exchange unit
800 Substrate processing system
802 Loading station
804 First vacuum lock
806 Heating station
808 Deposition station(s)
810 Second vacuum lock
812 Unloading station

The invention claimed is:

1. A conveyor assembly suitable for use with a substrate processing system, comprising:
   at least one substrate carrier having a substrate-carrying surface configured to support at least one substrate thereon;
   a processing track;
   a return track;
   a drive system configured to drive the substrate carrier along the processing track and the return track; and
   a first and a second swivel unit, both configured to pivot the substrate carrier around a substantially horizontal axis through an angle from about 70 to about 120 degrees from a first substantially horizontal orientation into a second orientation, and/or vice versa
   wherein the processing track is disposed substantially above or below the return track;
   wherein the first swivel unit is disposed between an end point of the processing track and a starting point of the return track, and the second swivel unit is disposed between an end point of the return track and a starting point of the processing track, such that the substrate carrier is transferred from the processing track to the return track, and/or vice versa, by the first or second swivel unit pivoting the substrate carrier between its first orientation and its second orientation; and wherein the conveyor assembly is configured to move the substrate carrier along the processing track in its first orientation, and to move the substrate carrier along the return track in its second orientation.

2. A conveyor assembly according to claim 1, wherein at least a portion of the processing track is defined by a first guide rail, and wherein the substrate carrier comprises a number of first rollers that are configured to cooperate with the first guide rail, such that the substrate carrier is rollably moveable over the first guide rail along said portion of the processing track.

3. A conveyor assembly according to claim 2, wherein at least a portion of the return track is defined by a second guide rail, and wherein the substrate carrier comprises a number of second rollers that are configured to cooperate with the second guide rail, such that the substrate carrier is rollably moveable over the second guide rail along said portion of the return track.

4. A conveyor assembly according to claim 3, wherein at least one swivel unit is configured to transfer a substrate carrier from the first guide rail of the processing track onto the second guide rail of the return track, and/or vice versa, by pivoting the substrate carrier around a substantially horizontal axis between its first orientation and its second orientation.

5. A conveyor assembly according to claim 4, wherein the at least one swivel unit configured to transfer a substrate carrier from the first guide rail of the processing track onto the second guide rail of the return track, and/or vice versa, comprises:

a first and a second guide rail extension, arranged such that the first guide rail extension is in alignment with the first guide rail when the swivel unit holds the substrate carrier in its first orientation, and wherein the second guide rail extension is in alignment with the second guide rail when the swivel unit holds the substrate carrier in its second orientation.

6. A conveyor assembly according to claim 2, wherein the drive system comprises:

at least one magnet, mounted on the substrate carrier.

7. A conveyor assembly according to claim 6, wherein the drive system further comprises:

a number of electric coils, disposed along the first or second guide rail and nearby positions along which the at least one magnet of the substrate carrier is moveable, which coil(s) can be powered to advance the substrate carrier along the first or second guide rail.

8. A conveyor assembly according to claim 6, wherein the drive system further comprises:

a driveable belt, disposed along the first or second guide rail and nearby positions along which the at least one magnet of the substrate carrier is moveable, which belt is configured to interact with the at least one magnet provided on the substrate carrier to drag the substrate carrier along the first or second guide rail, for example via magnetic interaction.

9. A conveyor assembly according to claim 1, further comprising a substrate carrier exchange unit, disposed in the processing track or the return track, and configured to remove a substrate carrier from and/or inserting a substrate carrier into a stream of carriers being conveyed along said track without interrupting said stream.

10. The conveyor assembly according to claim 9, wherein the substrate carrier exchange unit comprises:

a frame that is slideable between a first position and a second position;

a first exchanger guide rail section and a second exchanger guide rail section, both mounted on said frame;

wherein, when the substrate carrier exchange unit is disposed in the processing track, the first guide rail comprises two sections that respectively extend upstream and downstream of the substrate carrier exchange unit, and wherein the first exchanger guide rail section is in alignment with both said sections of the first guide rail when the frame is in its first position, and wherein the second exchanger guide rail section is in alignment with both sections of the first guide rail when the frame is its second position, such that in both positions of the frame a continuous processing track exists that is defined by both sections of the first guide rail and the first and/or second exchanger guide rail section, or wherein, when the substrate carrier exchange unit is disposed in the return track, the second guide rail comprises two sections that respectively extend upstream and downstream of the substrate carrier exchange unit, and wherein the first exchanger guide rail section is in alignment with both said sections of the second guide rail when the frame is in its first position, and wherein the second exchanger guide rail section is in alignment with both sections of the second guide rail when the frame is its second position, such that in both positions of the frame a continuous return track exists that is defined by both sections of the second guide rail and the first and/or second exchanger guide rail section.

11. A conveyor assembly according to claim 1, wherein the processing track at least partly extends through a conditioned environment, for example a vacuum environment.

12. A conveyor assembly according to claim 1, wherein the return track at least partly extends through an atmospheric environment, for example separate from a processing track environment.

13. A substrate processing system comprising:

a loading station configured to load the substrate carrier with at least one substrate;

one or more processing stations;

a discharge station configured to remove substrates from the substrate carrier; and a conveyor assembly according to claim 1.

14. A substrate processing system according to claim 13, further comprising:

a first load lock; and a second load lock;

the first and second load lock being configured to seal a conditioned environment, for example a vacuum environment, in which the one or more processing stations are disposed.

15. A method for conveying a substrate carrier, comprising:

providing a substrate carrier configured for carrying at least one substantially planar substrate;

conveying the substrate carrier along a processing track;

conveying the substrate carrier along a return track;

rotating the substrate carrier around a substantially horizontal axis from a first orientation into a second orientation; and conveying the substrate carrier along the return track in the second orientation;

rotating the substrate carrier around a substantially horizontal axis from the second orientation back into the first orientation;

conveying the substrate carrier along the processing track in the first orientation,
wherein the rotation of the substrate carrier from the first substantially horizontal orientation to the second orientation, and/or vice versa, involves a rotation through an angle from about 70 to about 120 degrees;
wherein the processing track is disposed substantially above or below the return track;
wherein the substrate carrier is rotated from the first orientation to the second orientation between an endpoint of the processing track and a starting point of the return track, and wherein the substrate carrier is rotated from its second to its first orientation between an end point of the return track to a starting point of the processing track such that the substrate is transferred from the processing track to the return track, and/or vice versa by said rotations between the first and second orientations.

16. A method according to claim 15, wherein rotating the substrate carrier from the first orientation into the second orientation involves rotating the substrate carrier back and forth between the first and second orientation and/or one or more intermediate orientations, so as to rock the substrate carrier.

17. A method according to claim 15, further comprising:
subjecting the substrate carrier to a gas flow, for example an air flow.

18. A method according to claim 15, further comprising:
subjecting the substrate carrier to vibrations to dislodge any contaminants from the substrate carrier.

19. A method according to claim 15, further comprising:
collecting any material falling off the substrate carrier due to, in particular, a change in its orientation or another specific action taken to dislodge material therefrom.

20. A method according to claim 15, further comprising processing one or more substrates disposed on the substrate carrier, wherein the action of rotating the substrate carrier from its first orientation into its second orientation is performed after properly processed substrates have been removed from the substrate carrier.

21. A method according to claim 15, wherein the first track and/or the second track extend at least partly through a conditioned environment, for example a vacuum environment.

22. A conveyor assembly according to claim 1, wherein:
in the first orientation, the substrate carrier is configured and arranged to support the at least one substrate in a substantially horizontal orientation; and
in the second orientation, the substrate carrier is configured and arranged to support the at least one substrate in a substantially vertical orientation.

23. A method according to claim 15, wherein the conveying the substrate carrier along a processing track comprises conveying the substrate in a substantially horizontal orientation and wherein the conveying the substrate carrier along a return track comprises conveying the substrate in a substantially vertical orientation.

* * * * *

UNITED STATES PATENT AND TRADEMARK OFFICE
CERTIFICATE OF CORRECTION

PATENT NO. : 8,528,722 B2
APPLICATION NO. : 13/059890
DATED : September 10, 2013
INVENTOR(S) : Clerkx et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 96 days.

Signed and Sealed this
Fifteenth Day of September, 2015

Michelle K. Lee
*Director of the United States Patent and Trademark Office*